（12） United States Patent
Buckley et al.

(10) Patent No.: US 6,488,497 B1
(45) Date of Patent: Dec. 3, 2002

(54) WAFER BOAT WITH ARCUATE WAFER SUPPORT ARMS

(75) Inventors: Richard Buckley, Shrewsbury, MA (US); John T. Vayda, West Brookfield, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 09/904,143

(22) Filed: Jul. 12, 2001

(51) Int. Cl.[7] ................................. F27D 5/00

(52) U.S. Cl. ..................... 432/258; 211/41.18

(58) Field of Search .................. 432/253, 258, 432/259; 211/41.18; 206/454

(56) References Cited

U.S. PATENT DOCUMENTS

| 5,492,229 A | * | 2/1996 | Tanaka et al. | 432/258 |
| 5,507,873 A | * | 4/1996 | Ishizuka et al. | 432/253 |
| 5,577,621 A | * | 11/1996 | Yi | 211/41.18 |
| 5,586,880 A | * | 12/1996 | Ohsawa | 432/253 |

* cited by examiner

Primary Examiner—Gregory Wilson
(74) Attorney, Agent, or Firm—McCormick, Paulding & Huber LLP

(57) ABSTRACT

A vertical ceramic wafer boat for supporting a silicon wafer having a predetermined radius R. The wafer boat comprises a base and a pair of column racks. The column racks extend generally vertically upwards from the base. Each column rack includes at least one arm having an arcuate section. Each arcuate section is sized to provide substantial support for a 0.7 R boundary region of the wafer and spans an arc of less than 180 degrees.

12 Claims, 6 Drawing Sheets

WAFER BOAT WITH ARCUATE WAFER SUPPORT ARMS

CROSS-REFERENCE TO RELATED APPLICATIONS

Some of the material disclosed herein is disclosed and claimed in the following U.S. patent application entitled "A Single Cast Vertical Wafer Boat With A Y Shaped Column Rack", by R. Buckley et al. Ser. No. 09/904,149, which is hereby incorporated by reference and filed concurrently herewith.

FIELD OF THE INVENTION

The present invention relates to semiconductor manufacturing. More specifically, the present invention relates to wafer boats having wafer support arms that contact and support a wafer along an arc of a circle.

BACKGROUND OF THE INVENTION

Although other materials may be used, e.g., Silicon-Germanium (SiGe) or Galium Arsenide (GaAs), Silicon (Si) is presently the most important semiconductor for the electronics industry. Very Large Scale Integrated (VLSI) circuit technology (i.e., up to about 100,000 devices per chip), and Ultra Large Scale Integrated (ULSI) circuit technology (i.e., more than 100,000 and in some cases exceeding one billion devices per chip) being based almost entirely on silicon.

It is critical that the fabrication of VLSI and ULSI circuits which take place on silicon substrates possess very high crystalline perfection or purity. That is, in crystalline solids, the atoms which make up the solid are spatially arranged in a periodic fashion. If the periodic arrangement exists throughout the entire solid, the substance is defined as being formed of a single crystal. The periodic arrangement of the atoms in the crystal is called the lattice. Very high crystalline perfection requires that the silicon substrate possess a minimum of impurities and structural defects throughout its single crystal silicon lattice.

Generally, raw material, e.g., quartzite, is refined into electronic grade polysilicon (EGS) and melted. A silicon seed crystal is than used to grow a single crystal silicon ingot from the molten EGS. The ingot is than precisely sliced and polished into silicon wafers. The silicon wafers provide the substrates upon which VLSI and ULSI circuits are ultimately built through a complex sequence of wafer fabrication processes.

The increasing size of silicon wafers is one of the most obvious trends in silicon material technology. Presently, 300 mm diameter wafers are expected to ultimately replace most 150 mm and 200 mm wafer applications. It is also predicted that 400 mm wafers will probably be introduced in the not too distant future. The use of larger diameter wafers for maintaining productivity presents several major challenges to semiconductor manufactures. For example, facilities with equipment capable of handling the larger wafers, e.g., vertical furnaces, must be built. New patterning techniques must be developed to print smaller feature sizes over larger areas. The larger wafers must also be thicker to increase their resistance to warping and other structural deformations. Moreover, the larger wafers are also heavier, requiring the use of automated wafer transport systems.

As the silicon wafers become bigger and heavier, the problem of preventing impurities and structural defects to the lattice, i.e., of maintaining very high crystalline perfection, becomes even more critical. Two such structural defects, which becomes especially problematic in 300 mm silicon wafers and larger, are that of "back side damage" and "slip" in the lattice structure.

Back side damage is when a wafer moves across a surface of a wafer support device, causing scratches in the back side of the wafer.

Slip in silicon wafers is a function of the stress applied to the wafer. This stress can be mechanical (e.g., frictionally induced) and/or thermal. As the wafers are stressed, the crystal lattice undergoes elastic deformation that disappears as the solid crystal returns to its original position upon release of the stress. However, severe stress leads to slip, which is the plastic or permanent deformation in the crystal lattice, which remains when the stress is released. Slip occurs when the elastic limit (or yield strength) of the silicon is exceeded and the lattice becomes permanently misaligned.

Slip is common during high temperature processing of silicon wafers in heat treatment furnaces (furnacing operations), as thermal stress is proportional to the processing temperature. The transition temperature from brittle to ductile behavior of the wafer is generally within the range of about 720 to 1000 degrees C. Therefore slip, whether induced by thermal or mechanical stress, becomes especially problematic at process temperatures above 720 degrees C.

Wafer boats are wafer support devices, which are subjected to furnacing operations during semiconductor wafer processing. Horizontal wafer boats are typically designed to support a horizontal row of wafers, which are inserted into a horizontal furnace tube for high temperature processing. Vertical wafer boats are typically designed to support a vertical stack of wafers, which are inserted into a vertical furnace tube. Generally, for large diameter silicon wafers, e.g., 300 mm, vertical wafer boats are more commonly used. This is because vertical furnaces have a smaller foot print than horizontal furnaces and therefore take up less of the expensive manufacturing space. Additionally, vertical furnaces generally demonstrate better temperature control than horizontal furnaces.

Wafer boats are generally composed of ceramic materials. Ceramic materials, which are joined by ionic or covalent bonds, are typically composed of complex compounds containing both metallic and non metallic elements. Ceramics typically are hard, brittle, high melting point materials with low electrical and thermal conductivity, good chemical and thermal stability, and high compressive strengths. Examples of ceramic materials are quartz, silicon carbide (SiC) and recrystalized SiC. One such recrystallized SiC is available from Saint-Gobain Ceramics & Plastics, Inc., of Worcester, Mass., under the trade name CRYSTAR®. This material is a silicon carbide ceramic that has been impregnated with high purity silicon metal.

Referring to FIG. 1, a typical prior art vertical wafer boat 10 generally includes three or four support rods 12 extending vertically upwards from a generally circular horizontal base 14, and spaced radially along the periphery of the base. The rods 12 have a plurality of cantilevered wafer support arms (or teeth) 16 supported only at one end, which extend inwardly toward the center of the base 14 to define a series of slots therebetween. The slots are sized to receive the silicon wafers, which are supported by the arms 16 during furnacing operations.

Problematically for larger wafers, the prior art wafer support arms 16 provide most of their support at the outer periphery of the wafer. Accordingly, most of the weight of the wafer is unsupported and distributed toward its center.

Therefore, during high temperature thermal processing, the center of the wafers tend to sag, promoting slip in the crystal lattice of the wafer.

Because of the geometry of the circular wafers, substantially half of the weight of the wafer, i.e., the inner wafer weight, is distributed within a circular area that is 70 percent the radius (R) of the wafer. Conversely, half of the weight of the wafer, i.e., the outer wafer weight, is distributed over a doughnut shaped area that has an inner radius of 0.7 R and an outer radius of 1.0 R. As a result, supporting the wafers at or about the 0.7 R circular boundary region of a wafer, e.g., from 0.6 R to 0.8 R, balances the inner and outer wafer weights and greatly reduces the potential for sagging during high temperature thermal processing.

Current prior art boat designs require deep slots, thereby making the arms 16 of the support rods 12 long enough to extend to the 0.7 R point. However, manufacturing this geometry is cumbersome due to the precise machining required and the inherently low yield rates. Also the added length of the cantilevered arms impose a large moment force at the single support point where the arm attaches to the rod body, unduly increasing the probability of failure or breakage. Moreover, because the arms provide support at only three or four small discrete areas on the wafers, the possibility of back side damage is enhanced for the heavier wafers.

One prior art attempt to solve this problem, is to provide a plurality of discrete circular ceramic rings, having an inner radius smaller than 0.7 R and an outer radius greater that 0.7 R. The rings would be slid into each slot and the wafers would then rest upon each ceramic ring.

However, each ring typically costs in the range of one thousand to two thousand dollars to manufacture, greatly adding to the cost of the boat. Additionally, the rings essentially enclose the support area where the wafers rest. This makes it difficult for conventional transfer equipment to get between the rings and wafers in order to remove the wafers from the slots. Additionally, the enclosed design impedes the free flow of gasses that are often important to the processing of the wafers. Also, since the rings typically add up to 100 additional discrete moving parts to the boats (one for each slot), the potential for generating particles or other impurities is greatly enhanced. That is, the ceramic rings can rub against the wafer support arms during processing or handling, and frictionally rub off microscopic particles which can damage the semiconductor circuitry of the wafers.

Accordingly, there is a need for an improved wafer boat, which can provide enhanced support to reduce wafer sag and minimize slip in large diameter silicon wafers, while also providing maximum openness for material handling, at a reasonable cost.

SUMMARY OF THE INVENTION

The present invention offers advantages and alternatives over the prior art by providing a wafer boat for supporting a silicon wafer with a predetermined radius of R. The wafer boat having wafer support arms that support the wafer along an arc of a circle that is substantially 0.7 R and that span less than 180 degrees of arc.

The invention provides a substantial number of advantages over the prior art. Since each wafer is being supported along a substantial portion of its 0.7 boundary region, sagging of the center portion of the wafer is greatly reduced. Additionally, the arcuate sections 50 do not enclose a full circle, therefore leaving a substantial open area for gas flow and material handling equipment.

These and other advantages are accomplished in an exemplary embodiment of the invention by providing a vertical ceramic wafer boat for supporting a silicon wafer having a predetermined radius R. The wafer boat comprises a base and a pair of column racks. The column racks extend generally vertically upwards from the base. Each column rack includes at least one arm having an arcuate section. Each arcuate section is sized to provide substantial support for a 0.7 R boundary region of the wafer and spans an arc of less than 180 degrees.

In an alternative embodiment of the invention, the arcuate sections can include a radius of from 0.6 R to 0.8 R or span an arc of from 90 to 135 degrees.

In another embodiment of the invention the base and the pair of column racks of the wafer boat form a single monolithic structure for supporting the wafer.

In another alternative embodiment of the invention, for each arcuate section of one column rack there is an opposing arcuate section on the other column rack for supporting the same wafer. Each of the opposing arcuate sections are oriented to support substantially half the weight of the wafer.

DETAILED DESCRIPTION OF THE PREFERRED EMBODIMENTS

Figure 1:
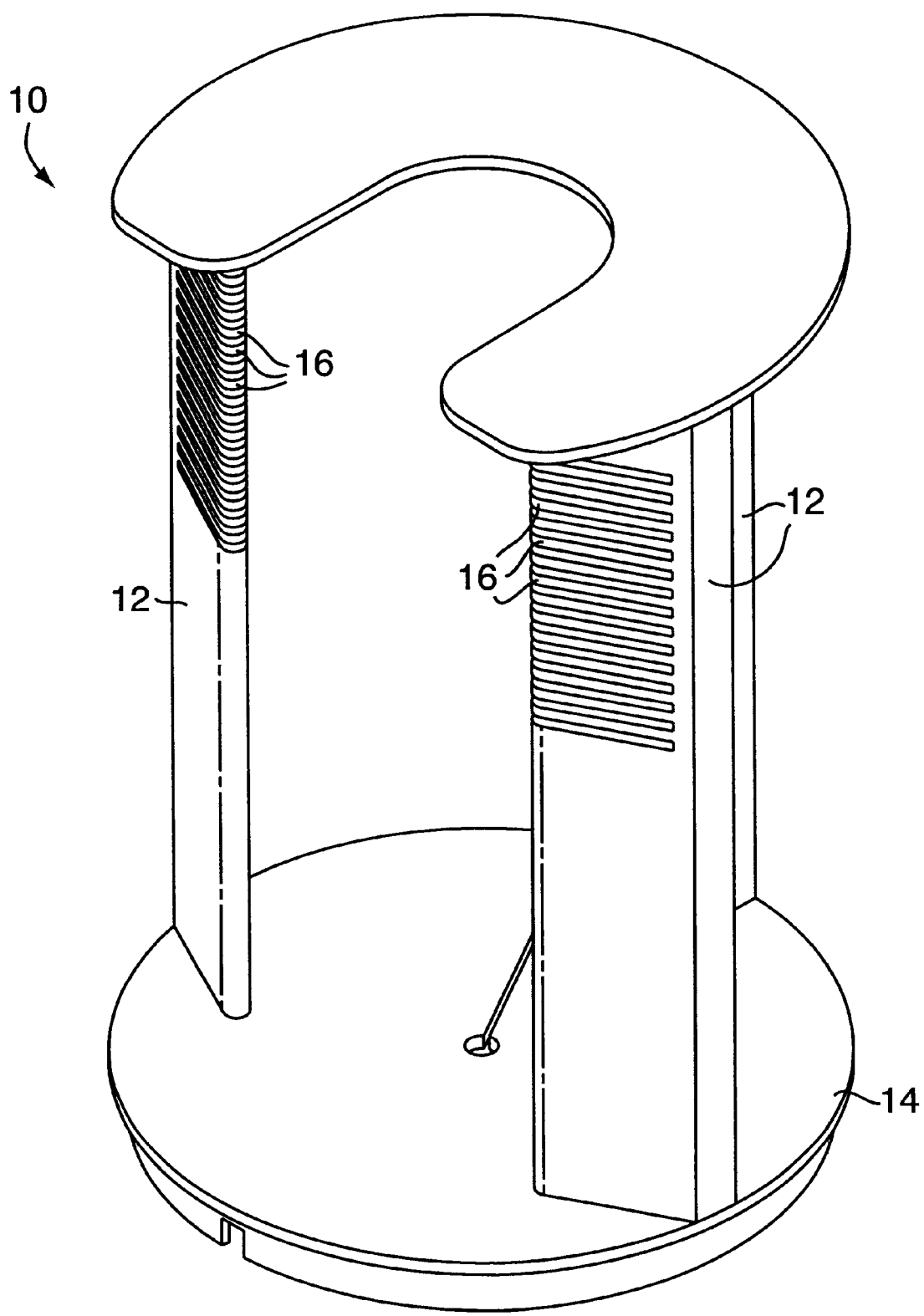
FIG. 1 is a perspective view of an exemplary embodiment of a prior art vertical wafer boat.
Figure 2:
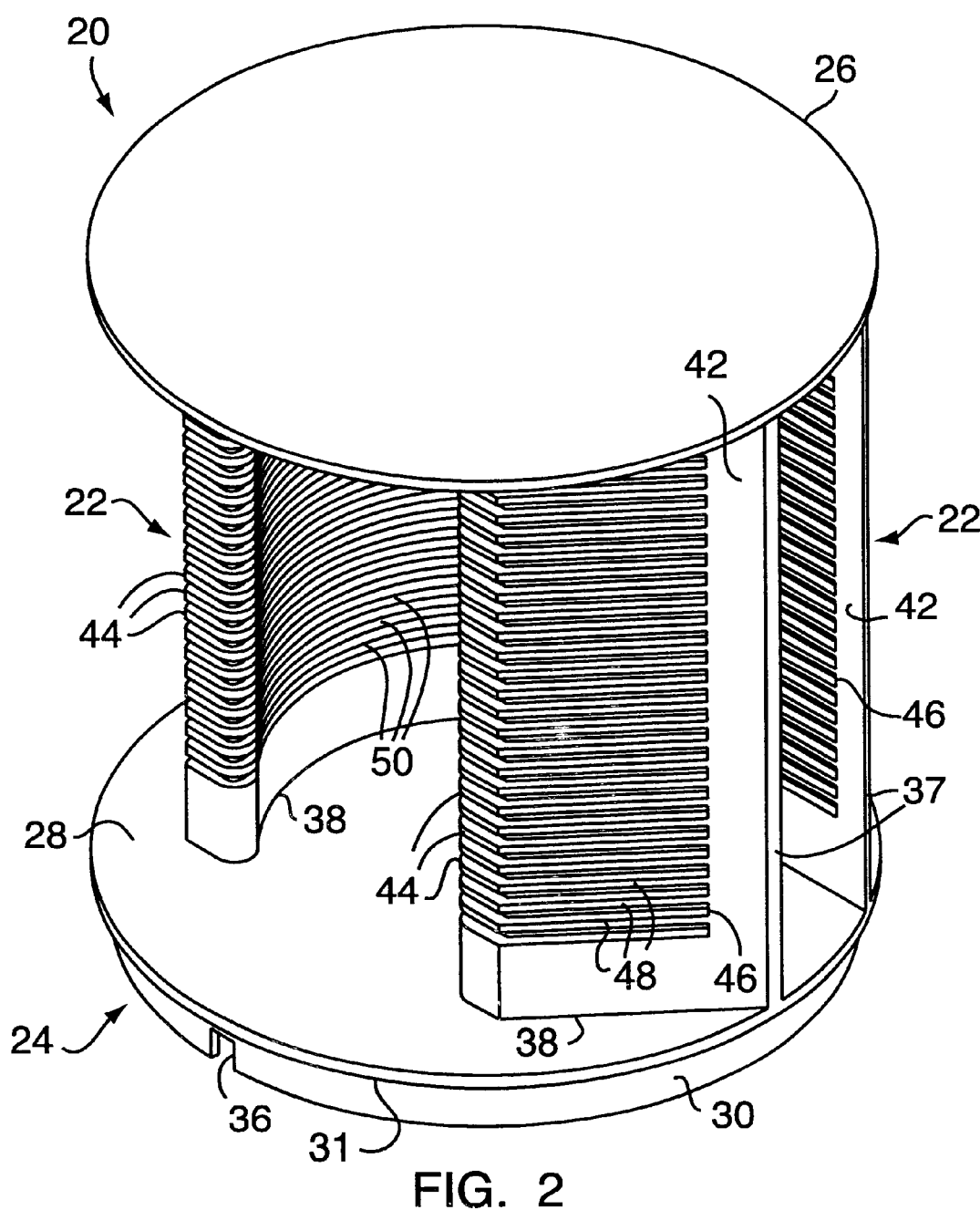
FIG. 2 is a perspective view of an exemplary embodiment of a vertical wafer boat in accordance with the present invention.
Figure 3:
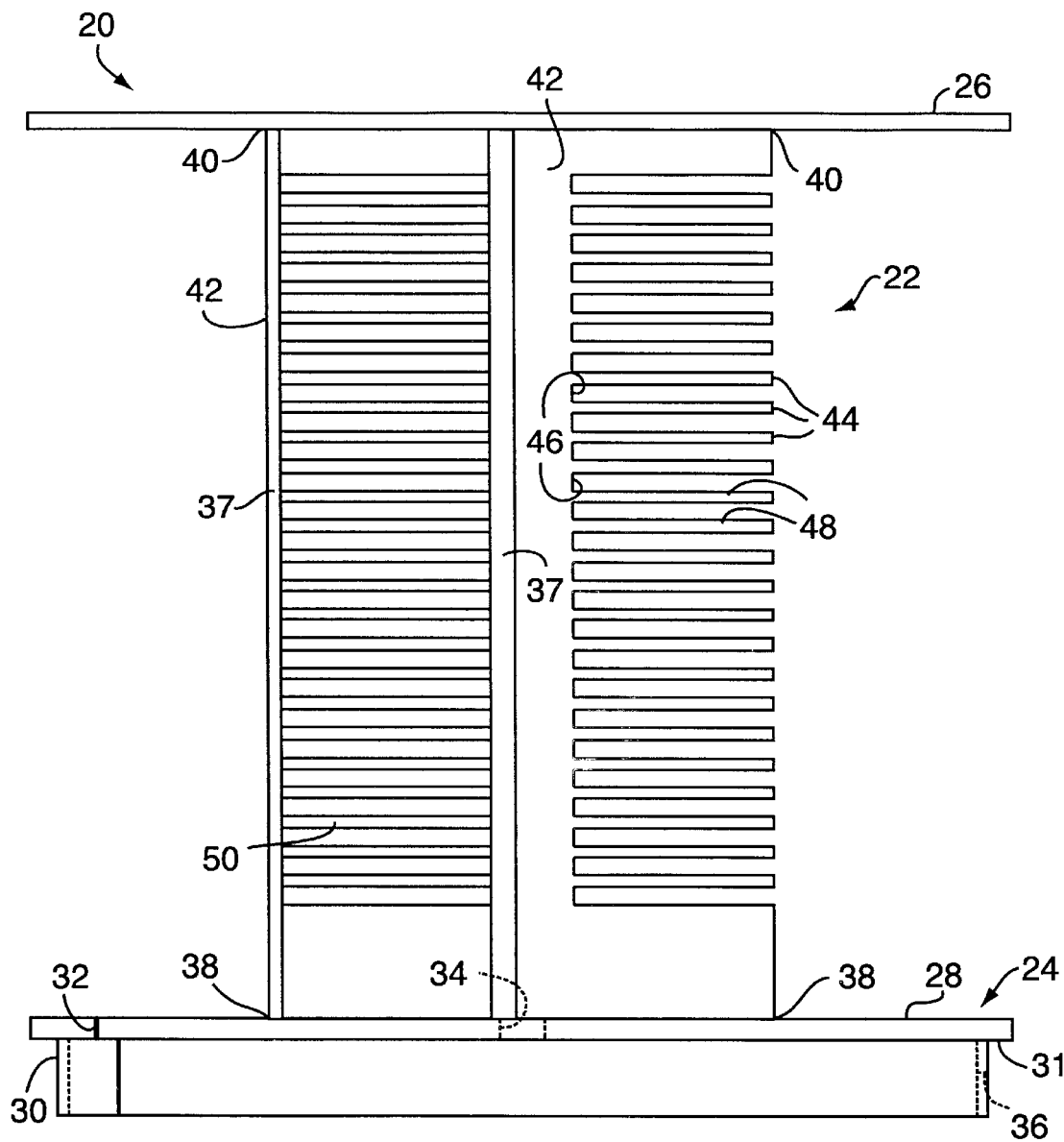
FIG. 3 is a front side view of the wafer boat of FIG. 2.
Figure 4:
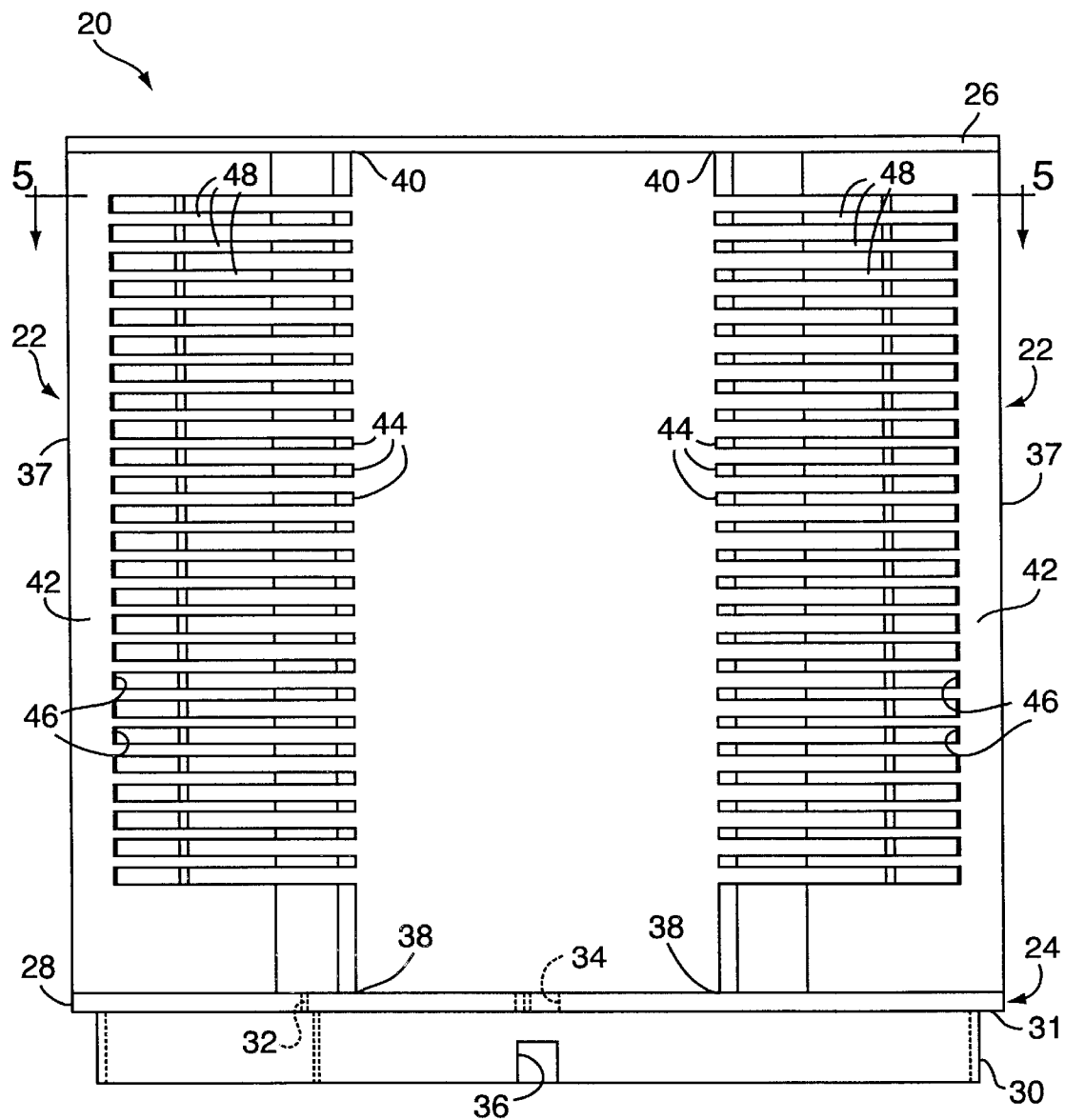
FIG. 4 is a left side view of the wafer boat of FIG. 2

Referring to FIGS. 2–5, a vertical wafer boat in accordance with the present invention is shown generally at 20. The entire wafer boat 20, i.e., the body of the wafer boat, is composed of cast recrystalized SiC and includes a pair of opposing support column racks 22, a base 24 and a generally circular top plate 26. As will be explained in greater detail hereinafter, the monolithic column racks 22 are sized to advantageously provide arcuate support to a silicon wafer at its 0.7 R boundary region, while maintaining an open area for transfer equipment to easily handle the wafers.

The base 24 is generally circular in shape and includes a generally horizontal flat base plate 28 having a predetermined diameter. The base 24 also includes a vertical rim 30 extending downwardly from the lower surface of the base plate 28. The rim 30 is concentric to and smaller in diameter than the base plate 28, such that the outer periphery of the horizontal base plate 28 extends over the vertical rim 30 to define a circular lip 31. An expansion slot (best seen in FIG. 5) 32 is cut radially outward from a center hole 34. The expansion slot 32 extends through the outer periphery of the base plate 28, as well through the rim 30. The slot 32 allows for thermal expansion and contraction of the base 24 during thermal operations, e.g., a furnacing operation. The vertical rim 30 also includes a rectangular locating notch 36, which correctly orients the wafer boat 20 when placed in a vertical furnace (not shown) during a furnacing operation.

Figure 5:
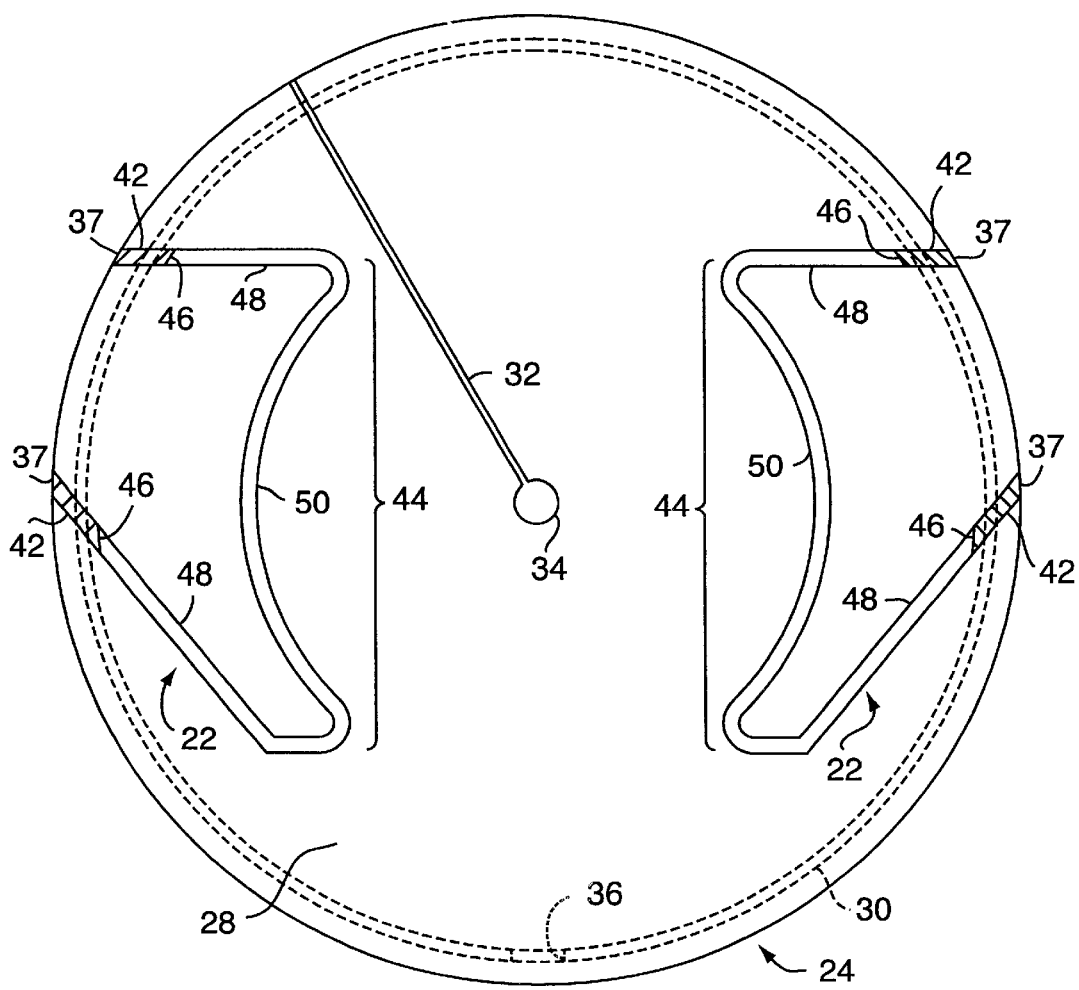
FIG. 5 is a cross-sectional view of the wafer boat of FIG. 4 taken along the line 5—5.

The support column racks 22 are elongated structures having a generally arcuate shaped cross section (best seen in FIG. 5). The outer edges 37 of the column racks 22 are oriented flush against the outer periphery of the base plate 28 and the column racks 22 are oriented on the base plate 28 to receive a predetermined diameter silicon wafer, e.g., 300 mm. The column racks 22 are welded to the upper surface of the base plate 28 at their lower distal ends 38 and extend substantially vertically upwards therefrom. The upper distal ends 40 of the column racks 22 are welded to the lower surface of the top plate 26, which is a circular shaped flat plate that extends substantially parallel to the base plate 28.

Though the column racks 22, base 24 and top plate 26 are described as being welded together to form a single monolithic structure, other assembly techniques are also within the scope to this invention, e.g., bolting, press fitting or chemically bonding the components together. Additionally mounting slots can be formed in the base 24 into which the column racks 22 can be press fit and held in fixed relation to each other.

Each column rack 22 includes a pair of continuous vertical portions 42, located proximate each outer edge 37 and from which a plurality of ceramic arms 44 extend toward the center of the base plate 28 to define a columnar rack. The ceramic arms 44 include a pair of anchored distal ends 46 which provide dual support for the ceramic arms 44. A pair of straight arm sections 48 extend from the anchored distal ends 46 in the general direction of the center portion of the base plate 28 and generally parallel to the base plate 28. The pair of straight arm sections 48 are integrally connected to an arcuate section 50 (seen in FIG. 5) of the ceramic arm 44.

The arcuate sections 50 are designed to provide substantial support for the 0.7 R boundary region of wafers having a predetermined radius R. For each arcuate section 50 of a column rack 22 there is an opposing arcuate section on the other column rack 22. The two opposing arcuate sections 50 are oriented to support substantially half the weight of a wafer. The arcuate section 50 in this embodiment would typically include a radius of from 0.6 R to 0.8 R. Also the arcuate section typically spans an arc of from 90 to 135 degrees, but must always span an arc of less than 180 degrees in order to leave an open area for gas flow and material handling as explained below.

The design of the arms 44, provides a substantial number of advantages over the prior art. Since each wafer is being supported along a substantial portion of its 0.7 boundary region, sagging of the center portion of the wafer is greatly reduced. Because each arm 44 is supported at two anchored distal ends 46, as opposed to one, the heavier wafers can be more easily supported and the potential for the arms 44 to break are greatly reduced. Additionally, the arcuate sections 50 do not enclose a full circle, i.e. each arc spans less than 180 degrees, therefore leaving a substantial open area for gas flow and material handling equipment. Also, each column rack 22 is a monolithic structure for supporting the wafers at the 0.7 R boundary region. Therefore, in contrast to prior art designs which utilized a large plurality of discrete moving parts such as rings, the potential for generating damaging particles is greatly reduced.

Figure 6:
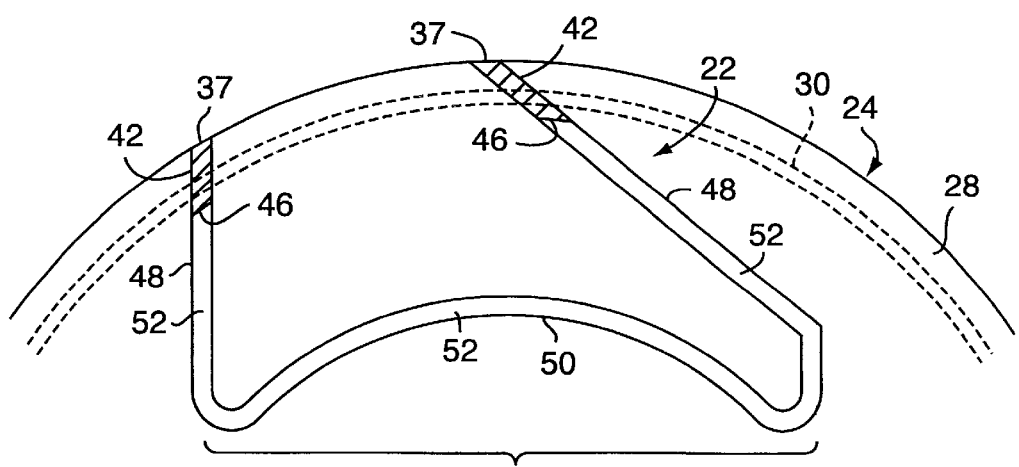
FIG. 6 is top view of an exemplary embodiment of an arcuate support arm in accordance with the present invention.
Figure 7:
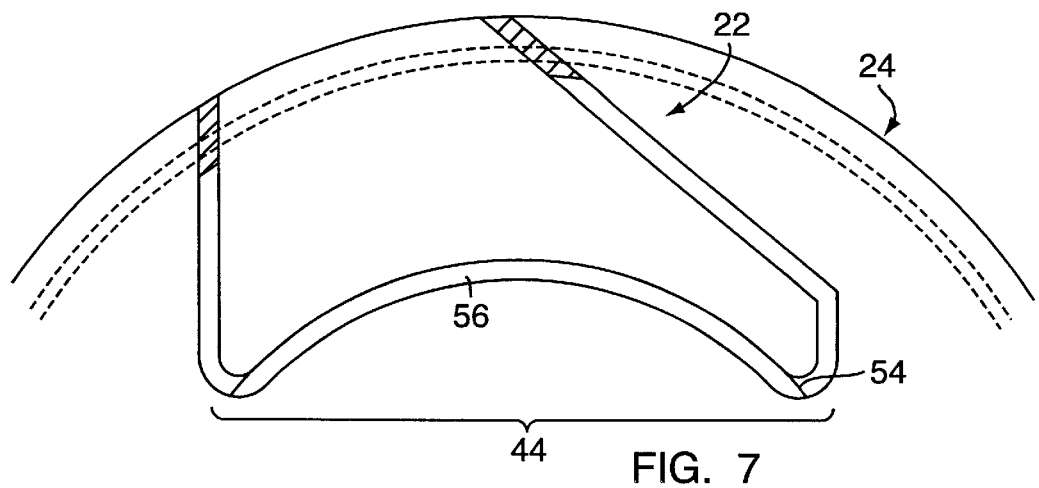
FIG. 7 is a top view of an exemplary embodiment of an arcuate support arm with raised wafer support pads in accordance with the present invention.

Referring to FIGS. 6 and 7, two different embodiments of the ceramic arms 44 are shown. The surfaces on the ceramic arms 44 of the wafer boat 20 which come into contact and support the weight of the silicon wafers are typically called wafer contact surfaces. In FIG. 6 the wafer contact surface is substantially the entire top flat surface 52 of the ceramic arm 44. This provides maximum support over a large surface area. In FIG. 7 a raised pad 54 is disposed on the top of arm 44 and the top surface 56 of the pad 54 is the wafer contact surface. In this case the possibility of "back side damage", e.g., scratches, is reduced, and the support at the 0.7 R boundary region is still maintained.

Figure 8:
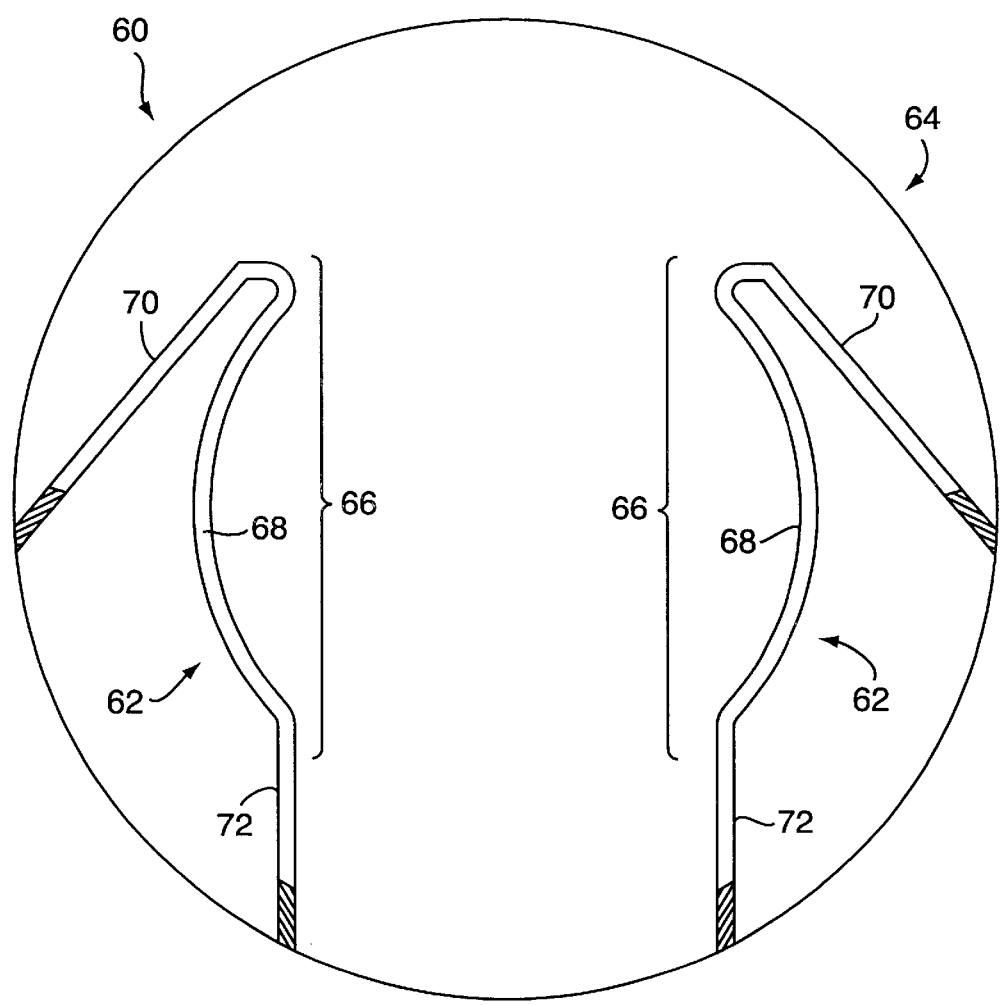
FIG. 8 is a cross sectional view of an alternative embodiment of a wafer boat in accordance with the present invention.

Referring to FIG. 8, in an alternative exemplary embodiment showing a wafer boat having a different cross sectional geometry is shown at 60. The wafer boat 60 includes a pair of opposing column racks 62 extending generally vertically from a base 64. The column racks 62 include a plurality of ceramic arms 66. Each ceramic arm has an arcuate section 68 and a pair of straight support arm sections 70 and 72. With the support arm sections 72 located in the back of the wafer boat 60, the furnace automation equipment can utilize them to obtain feedback on wafer positioning during process.

Although these exemplary embodiments discuss a wafer boats sized for 300 mm diameter wafers, a wafer boat in accordance with this invention may be sized for other wafer diameters as well, e.g., 150 mm, 200 mm, or 400 mm. Additionally the wafer boat may also be composed of ceramics other than recrystallized SiC, e.g., quartz, sintered SiC, or poly-silicon.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A vertical ceramic wafer boat for supporting a silicon wafer having a predetermined radius R, the wafer boat comprising:
   a base; and
   a pair of column racks extending generally vertically upwards from the base, each column rack including at least one arm having an arcuate section and including a pair of anchored distal ends attached to the column rack;
   wherein each arcuate section is sized to provide substantial support for a 0.7 R boundary region of the wafer and spans an arc of less than 180 degrees.

2. The wafer boat of claim 1 wherein the arcuate section includes a radius of from 0.6 R to 0.8 R.

3. The wafer boat of claim 1 wherein the arcuate section spans an arc of from 90 to 135 degrees.

4. The wafer boat of claim 1 wherein the base and the pair of column racks form a single monolithic structure for supporting the wafer.

5. The wafer boat of claim 1 wherein the arcuate section of the arm includes a top surface that defines a wafer contact surface for supporting the wafer.

6. The wafer boat of claim 1 wherein the arcuate section of the arm includes a raised pad having a top surface that defines a wafer contact surface for supporting the wafer.

7. The wafer boat of claim 1 wherein the ceramic is one of quartz, silicon carbide (SiC) and recrystallized SiC.

8. The wafer boat of claim 1 wherein the column rack comprises a plurality of arms.

9. The wafer boat of claim 1 wherein, for each arcuate section of a one of the pair of column racks, there is an opposing arcuate section on the other of the pair of column racks for supporting the same wafer.

10. The wafer boat of claim 9 wherein each arcuate section of the opposing arcuate sections supports substantially half the weight of the wafer.

11. The wafer boat of claim 1 wherein the column racks comprise:

a pair of continuous substantially vertical portions extending upwardly from the base; and each anchored distal end attached to one of each vertical portion.

12. The wafer boat of claim 11 wherein each arm includes a pair of substantially straight arm sections extending from the anchored distal ends generally parallel to the base, the straight arm sections being connected to the arcuate section.

* * * * *